United States Patent
Uesaka

(10) Patent No.: US 7,492,797 B2
(45) Date of Patent: Feb. 17, 2009

(54) LASER DRIVER CIRCUIT

(75) Inventor: Katsumi Uesaka, Yokohama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 184 days.

(21) Appl. No.: 11/113,324

(22) Filed: Apr. 25, 2005

(65) Prior Publication Data

US 2005/0238072 A1 Oct. 27, 2005

(30) Foreign Application Priority Data

Apr. 27, 2004 (JP) .......................... P2004-131848

(51) Int. Cl.
*H01S 3/00* (2006.01)
(52) U.S. Cl. ................. 372/38.01; 372/38.02
(58) Field of Classification Search ............ 372/29.021, 372/38.04
See application file for complete search history.

(56) References Cited

U.S. PATENT DOCUMENTS

| | | | | |
|---|---|---|---|---|
| 3,749,476 A * | 7/1973 | Daly et al. ............... | 359/286 |
| 4,733,398 A * | 3/1988 | Shibagaki et al. ........... | 372/31 |
| 4,813,048 A * | 3/1989 | Yamane et al. ............ | 372/38.07 |
| 4,835,782 A * | 5/1989 | Kaede et al. .................. | 372/32 |
| 5,020,062 A * | 5/1991 | Cusack et al. ................ | 372/23 |
| 5,224,112 A | 6/1993 | Uesaka | |
| 5,268,916 A * | 12/1993 | Slawson et al. ........ | 372/29.021 |
| 5,473,460 A * | 12/1995 | Haner et al. ................. | 398/194 |
| 6,466,595 B2 * | 10/2002 | Asano .................... | 372/29.021 |
| 2003/0231853 A1 * | 12/2003 | Sato et al. .................... | 385/147 |

FOREIGN PATENT DOCUMENTS

JP 04-139779 5/1992
JP 09-092916 4/1997

* cited by examiner

*Primary Examiner*—Minsun Harvey
*Assistant Examiner*—Sean Hagan
(74) *Attorney, Agent, or Firm*—Smith, Gambrell & Russell, LLP

(57) ABSTRACT

A laser driver circuit driving a laser diode to generate an optical output corresponding to an input data, and controlling the optical output based on an output current from a photodiode that detects the optical output. The output current is converted into a voltage signal, whose amplitude is detected after filtering the voltage signal by a low-pass filter. A reference signal corresponding to the input data is generated, and its amplitude is detected. A modulator for generating a modulation current regulates the amplitude of the modulation current according to the difference between the two detected amplitudes.

8 Claims, 8 Drawing Sheets

LASER DRIVER CIRCUIT

BACKGROUND OF THE INVENTION

1. Field of the Invention

The present invention relates to an electronic circuit for driving a laser diode.

2. Related Background Art

There are known laser driver circuits of a peak detection type for stabilizing both the average output power and the extinction ratio of a laser diode.

Japanese Patent Application Laid-Open No. 4-13977 discloses an AC-coupled laser driver circuit. The driver circuit disclosed in the application is configured to detect an average output current from a monitor photodiode and to control the magnitude of a bias current supplied to a laser diode depending on the detected average current. This driver circuit controls the modulation current based on the average and peaks of the optical output from the laser diode. Controlling the bias current stabilizes the average output power, and controlling the modulation current stabilizes the extinction ratio.

Japanese Patent Application Laid-Open No. 9-92916 discloses another laser driver circuit. This driver circuit is configured to detect the average and peaks of an output current from a monitor photodiode to control the duty ratio of a driving pulse depending on the detected average current, and to control the magnitude of the current according to the peaks. Controlling the duty ratio stabilizes the average output power, and controlling the magnitude of the current stabilizes the extinction ratio.

For detecting the amplitude of the output current from the photodiode, it is common practice to use a current-voltage converter having a broad bandwidth to convert the output current to a voltage signal (i.e., monitoring signal) and detect the peak-to-peak value thereof. However, the laser diode driving current (up to several tens mA induces crosstalk noise in the photodiode output current (several tens μA to several, therefore, it is difficult to accurately detect the peaks of the monitoring signal. Consequently, the optical output from the laser diode is likely to be unstable.

An object of the present invention is to provide a laser driver circuit capable of adequately stabilizing the optical output from a laser diode.

SUMMARY OF THE INVENTION

A laser driver circuit in accordance with the invention drives a laser diode to generate an optical output corresponding to an input data signal. The laser driver circuit controls the optical output based on an output current from a photodiode for detecting the optical output. The laser driver circuit comprises a biasing section for supplying a bias current to the laser diode, a modulator for generating a modulation current corresponding to the input data signal to add the modulation current to the bias current, a first current-voltage converter for converting the output current from the photodiode into a voltage signal, a first low-pass filter for filtering the voltage signal, a first amplitude detector for detecting an amplitude of the voltage signal filtered by the first low-pass filter, a reference signal generator for generating a reference signal corresponding to the input data signal, and a second amplitude detector for detecting an amplitude of the reference signal. The modulator regulates an amplitude of the modulation current according to a difference between the amplitudes detected by the first and second amplitude detectors.

The input data signal has a data transmission rate, and the first low-pass filter may have a cutoff frequency lower than the data transmission rate.

The laser driver circuit may further comprise a second low-pass filter having a frequency characteristic substantially identical to that of the first low-pass filter. The reference signal may be filtered by the second low-pass filter. The second amplitude detector may detect the amplitude of the reference signal filtered by the second low-pass filter.

The laser driver circuit may further comprise a filter controller for adjusting the frequency characteristics of the first and second low-pass filters according to the data transmission rate of the input data signal.

The reference signal generator may include a reference current generator for generating a reference current corresponding to the input data signal, and a second current-voltage converter for converting the reference current into a reference voltage signal. The second current-voltage converter may have a configuration identical to that of the first current-voltage converter.

The laser driver circuit may further comprise a first average detector for detecting an average of the voltage signal. The biasing section may regulate a magnitude of the bias current according to the average of the voltage signal.

The laser driver circuit may further comprise a second average detector for detecting an average of the reference signal. The biasing section may regulate the magnitude of the bias current according to a difference between the averages detected by the first and second average detectors.

The laser diode has an anode and a cathode. The modulator may have a first output terminal coupled with the anode via a capacitor, and a second output terminal coupled with the cathode via another capacitor. The modulation current may include a first modulation current having the same phase as that of the input data signal, and a second modulation current having an inverted phase with respect to the input data signal. The modulator may generate the first modulation current at one of the first and second output terminals, and the second modulation current at the other of the first and second output terminals.

This invention will more fully appear from the following detailed description and the accompanying drawings. It is to be expressly understood, however, that the drawings are for the purpose of illustration only, and are not intended as a definition of the limits of the invention.

DESCRIPTION OF THE PREFERRED EMBODIMENTS

Embodiments of the present invention will be described below in detail with reference to the accompanying drawings. The same elements will be denoted by the same symbols in the descriptions and the drawings, without overlapping descriptions.

First Embodiment

Figure 1:
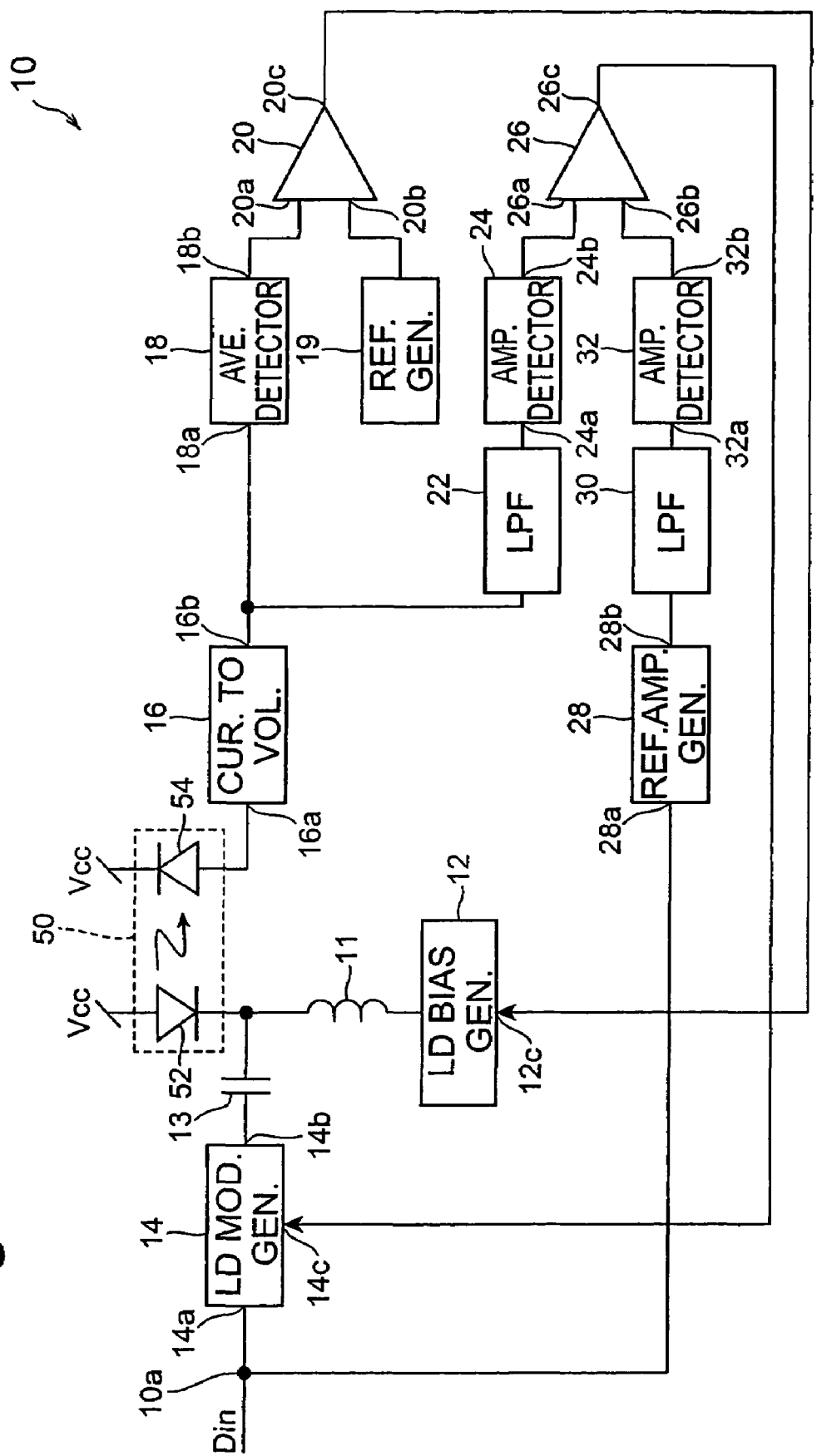
FIG. 1 is a diagram showing the configuration of a laser driver circuit of a first embodiment.

FIG. 1 is a diagram showing the configuration of an AC-coupled laser driver circuit according to a first embodiment of the invention. The laser driver circuit 10 is for driving laser module 50, which has a laser diode (hereinafter referred to as "LD") 52 and a photodiode (hereinafter referred to as "PD") 54. The laser driver circuit 10 supplies a driving current to the LD 52 so that the LD 52 generates an optical output. The driving current is modulated in response to an input data signal "Din" fed to the laser driver circuit 10. Accordingly, the LD 52 emits an optical signal indicating the same data as the input data signal Din does. The PD 54 is a light receiving element for detecting the optical output from the LD 52. The PD 54 receives the optical output from the LD 52 to generate an output current corresponding to the optical output.

The laser driver circuit 10 includes a bias current generator 12 and a modulation current generator 14. The laser driver circuit 10 is electrically connected to the laser module 50. A positive power supply Vcc to apply a forward bias voltage to the LD 52 is connected to the anode of the LD 52. The bias current generator 12 is connected to the cathode of the LD 52 via an inductor 11, and the modulation current generator 14 is also connected to the cathode of the LD 52 via a capacitor 13.

The bias current generator 12 supplies a forward bias current to the LD 52. The bias current generator 12 has a control terminal 12c. As will be described later, the magnitude of the bias current is adjusted according to a voltage applied to the control terminal 12c. An input terminal 14a of the modulation current generator 14 is connected to a data input terminal 10a of the laser driver circuit 10. The input data signal Din is supplied from an external signal generator (not shown) to the data input terminal 10a. The modulation current generator 14 receives the input data signal Din through the input terminal 14a to generate a modulation current corresponding to the input data signal Din at an output terminal 14b, and adds it to the bias current. The modulation current has a frequency equal to a data transmission rate of the input data signal Din. Thus, the bias current is modulated at the modulation frequency equal to the data transmission rate. The modulation current generator 14 further includes a control terminal 14c. As will be described later, the amplitude of the modulation current is adjusted according to a voltage applied to the control terminal 14c. The inductor 11 prevents the AC modulation current from flowing into the bias current generator 12, and the capacitor 13 prevents the DC bias current from flowing into the modulation current generator 14.

Figure 2:
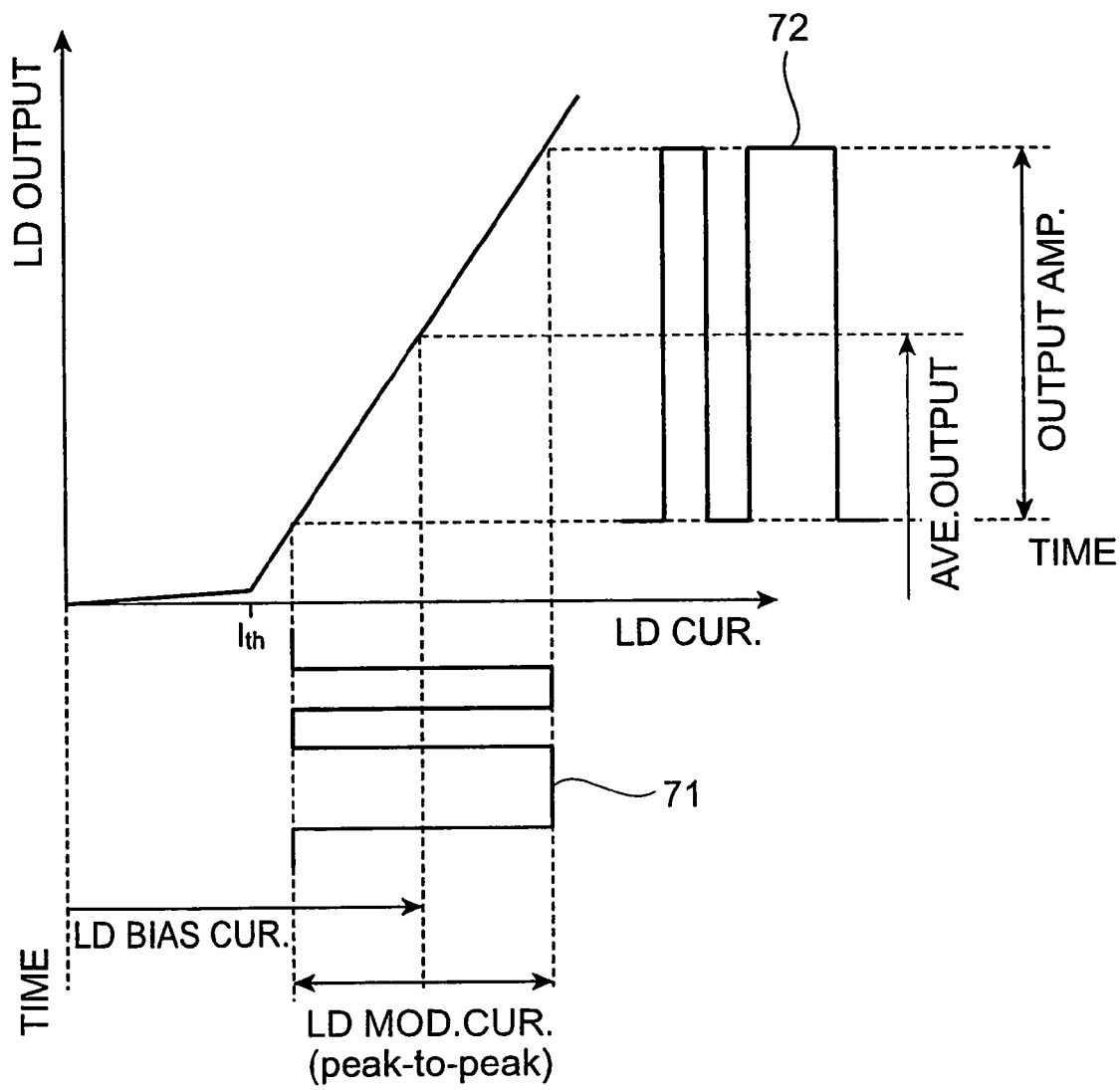
FIG. 2 is a diagram showing an output characteristic of a laser diode.

FIG. 2 is a diagram showing the output characteristic of LD 52. In FIG. 2, the horizontal axis represents the forward current flowing in LD 52 (hereinafter referred to as "LD current"), and the vertical axis represents the optical output power of the LD 52. In addition, the symbol $I_{th}$ indicates the threshold current of the LD 52. The lower part of FIG. 2 illustrates a waveform 71 of the LD current, and the right part illustrates a waveform 72 of the optical output emitted from the LD 52 in response to the LD current. The LD current is a sum of the modulation current generated by the modulation current generator 14 and the bias current generated by the bias current generator 12.

The laser driver circuit 10 further includes circuits for controlling the optical output from the LD 52 based on the output current of the PD 54. This circuit will be described later.

The power supply Vcc is connected to the cathode of the PD 54 to apply a reverse bias voltage to the PD 54. An input terminal 16a of a current-voltage converter 16 is connected to the anode of the PD 54. The current-voltage converter 16 receives the output current of the PD 54 to convert it into a voltage signal (hereinafter referred to as "monitoring signal"). This monitoring signal appears at an output terminal 16b of the current-voltage converter 16.

An input terminal 18a of an average detector 18 is connected to the output terminal 16b. The average detector 18 receives the monitoring signal from the current-voltage converter 16 to detect the average of the monitoring signal. This average is equivalent to the average of the output current of the PD 54, and thus equivalent to the average of the optical output power of the LD 52. The average detector 18 generates an output voltage corresponding to the detected average at an output terminal 18b thereof.

The output terminal 18b is connected to a first input terminal 20a of a differential amplifier 20. The output voltage of the average detector 18 is applied to the first input terminal 20a. A reference voltage generator 19 is connected to a second input terminal 20b of the differential amplifier 20. The reference voltage generator 19 generates a fixed reference voltage and applies it to the second input terminal 20b.

The differential amplifier 20 generates at its output terminal 20c an output voltage corresponding to a difference between the output voltage of the average detector 18 and the reference voltage. The output terminal 20c is connected to the control terminal 12c of the bias current generator 12. Consequently, the output voltage of the differential amplifier 20 is applied to the control terminal 12c.

The bias current generator 12 adjusts the magnitude of the bias current according to the output voltage of the differential amplifier 20. Specifically, the magnitude of the bias current is negatively feedbacked to stabilize the output voltage of the average detector 18. Thus, the laser driver circuit 10 adjusts the bias current according to the average of the optical output of the LD 52 to stabilize the average power of the optical output.

An amplitude detector 24 is also connected to the output terminal 16b of the current-voltage converter 16 via a first low-pass filter 22. The low-pass filter 22 filters the monitoring signal generated by the current-voltage converter 16 to cut the high-frequency band of the monitoring signal. The low-pass filter 22 has a predetermined cutoff frequency, and substantially attenuates frequency components higher than the cutoff frequency. In this embodiment, the low-pass filter 22 may have the cutoff frequency lower than the data transmission rate of the input data signal Din.

The monitoring signal filtered by the low-pass filter 22 is supplied to an input terminal 24a of the first amplitude detector 24. The amplitude detector 24 detects the amplitude of the filtered monitoring signal. An output voltage corresponding to the detected amplitude is generated at an output terminal 24b of the amplitude detector 24. The output terminal 24b is connected to a first input terminal 26a of a differential amplifier 26, and the output voltage of the amplitude detector 24 is applied to the first input terminal 26a.

An output terminal 32b of a second amplitude detector 32 is connected to a second input terminal 26b of the differential amplifier 26. An input terminal 32a of the amplitude detector 32 is connected to an output terminal 28b of a reference amplitude generator 28 via a second low-pass filter 30. An input terminal 28a of the reference amplitude generator 28 is connected to the data input terminal 10a.

The reference amplitude generator 28 receives the input data signal Din through the data input terminal 10a to generate a reference voltage signal at the output terminal 28b. This reference voltage signal is a pulse signal corresponding to the input data signal Din. The reference voltage signal has constant amplitude, rises, and falls according to the oscillation of the input data signal Din. The reference amplitude generator 28 may generate the reference voltage signal by simply amplifying the input data signal Din, for example.

The low-pass filter 30 has the frequency characteristic and the cutoff frequency substantially identical to those of the low-pass filter 22. The low-pass filter 30 filters the reference voltage signal to cut its high-frequency band. The low-pass filter 30 substantially attenuates frequency components higher than the cutoff frequency.

The reference voltage signal filtered by the low-pass filter 30 is supplied to the input terminal 32a of the second amplitude detector 32. The amplitude detector 32 detects the amplitude of this reference voltage signal. An output voltage corresponding to the detected amplitude is generated at the output terminal 32b of the amplitude detector 32. This results in applying the output voltage of the amplitude detector 32 to the second input terminal 26b of the differential amplifier 26.

The differential amplifier 26 generates at its output terminal 26c an output voltage corresponding to the difference between the output voltages from the amplitude detectors 24 and 32. The output terminal 26c is connected to the control terminal 14c of the modulation current generator 14, and therefore the output voltage of the differential amplifier 26 is applied to the control terminal 14c.

The modulation current generator 14 adjusts the amplitude of the modulation current according to the output voltage of the differential amplifier 26. Specifically, the generator 14 performs a negative-feedback control on the amplitude of the modulation current to stabilize the output voltage of the amplitude detector 24. Thus, the laser driver circuit 10 regulates the amplitude of the modulation current according to the amplitude of the optical output of the LD 52 to stabilize its extinction ratio. This makes it feasible to prevent unstable operation of the LD 52 due to individual unevenness of the LD 52 or change in the temperature of the LD 52.

The features of this embodiment will now be described. In general, a driver circuit of a peak detection type for stabilizing both the average power and the extinction ratio of the LD uses a current-voltage converter having a wide bandwidth to enable the peak detection of the current from the monitor PD. However, if the bandwidth of the current-voltage converter is too wide, the driver circuit will fail to detect the correct peak current because of the influence from the crosstalk noise induced in the current of the monitor PD (several tens μA to several mA) by the LD driving current (up to several tens mA). The crosstalk noise is included in the monitor PD current as components having frequencies equal or higher than the frequency of the monitoring signal.

In the present embodiment, the low-pass filter 22 is provided between the current-voltage converter 16 and the amplitude detector 24. The low-pass filter 22 cuts the high-frequency component of the output voltage signal (monitoring signal) of the current-voltage converter 16 to reduce the crosstalk noise. Therefore, the amplitude detector 24 is able to accurately detect the peaks and the amplitude of the monitoring signal. In consequence, the amplitude of the optical output from the LD 52 can be accurately monitored to regulate the amplitude of the modulation current according to the monitored amplitude, thereby appropriately stabilizing the extinction ratio of the optical output.

Figure 3:
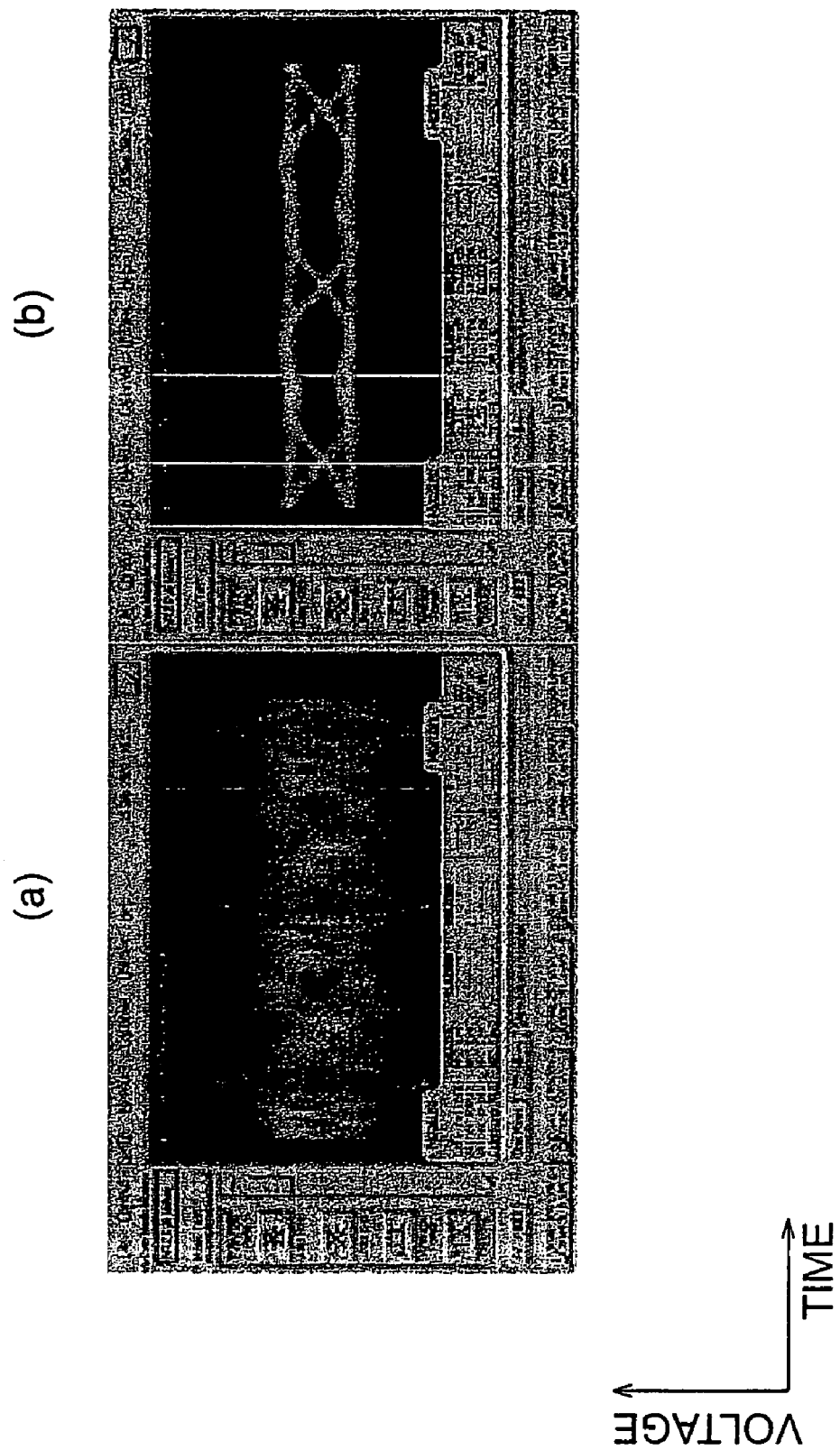
FIG. 3 is an illustration showing eye patterns of monitoring signals.

The effect of reducing the crosstalk noise will become more apparent by comparison between patterns shown in FIG. 3. FIG. 3 shows eye diagrams of the monitoring signal depending on output currents from the monitor PD. The monitor PD current is converted to the voltage signal, i.e., monitoring signal, using the current-voltage converter, and the eye diagrams in FIG. 3 are generated using this monitoring signal. In the charts in FIG. 3, the horizontal axis represents time, and the vertical axis the magnitude of the monitoring voltage signal, respectively. The data transmission rate of the optical output from the LD is 2.5 Gb/s.

FIG. 3 (a) shows the eye diagram obtained without cutting high-frequency component of the current-voltage converter. As shown in this diagram, the crosstalk noise superimposed on the monitoring signal makes it difficult to determine the peaks and the amplitude of the monitoring signal. On the other hand, FIG. 3 (b) shows the eye diagram obtained with a restriction on the bandwidth of the current-voltage converter using a low-pass filter. This low-pass filter has the cutoff frequency of 2 GHz, which is lower than the data transmission rate. Since the low-pass filter reduces the crosstalk noise included in the monitoring signal, the peaks and amplitude of the monitoring signal can be accurately detected. Thus, the crosstalk noise can be adequately reduced by filtering the monitoring signal using the low-pass filter 22 with the cutoff frequency lower than the data transmission rate.

The crosstalk noise can be removed more significantly by further lowering the cutoff frequency of the low-pass filter 22. However, it will also result in larger amount of attenuation of the amplitude of the monitoring signal. As the cutoff frequency becomes lower relative to the frequency of the monitoring signal, the attenuation amount of its amplitude increases. The frequency of the monitoring signal depends on the data transmission rate, and therefore, the detected peaks and amplitude of the monitoring signal will vary according to the data transmission rate, thereby allowing the extinction ratio of the optical output of the LD 52 to be unstable.

Furthermore, the frequency of the monitoring signal also depends on a data pattern as well as the data transmission rate. Therefore, the detected amplitudes of the monitoring signal will vary according to the data pattern, and it can also result in allowing the extinction ratio to be unstable. Here the data pattern of the optical output means a bit sequence pattern in the optical output. This is the same as the data pattern of the input data signal Din.

Figure 4:
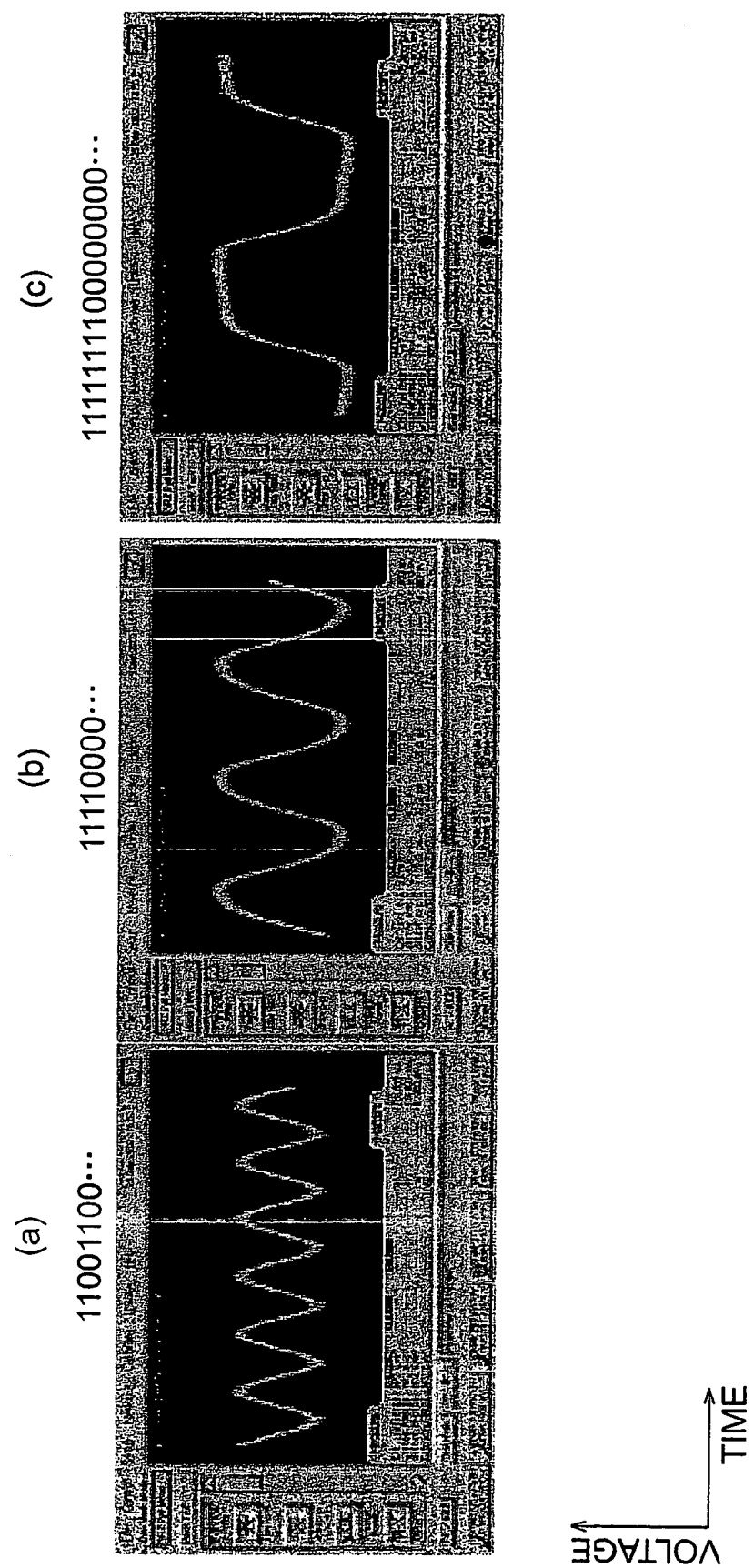
FIG. 4 is a diagram showing filtered monitoring signals.

FIG. 4 shows the dependence of the waveform on the input data pattern when the bandwidth of the monitoring signal is restricted by the low-pass filter. In the charts included in FIG. 4, the horizontal axis represents time, and the vertical axis the voltage. FIG. 4 (a) to (c) show respective waveforms of output signals from the low-pass filter obtained where the input data signal has data patterns of "11001100 . . . ," "11110000 . . . ," and "1111111100000000 . . . ," respectively. The data transmission rate of the optical output is 2.5 Gb/s and the cutoff frequency of the low-pass filter is 0.467 GHz.

As shown in FIG. 4 (a) to (c), as the optical output has the data pattern of longer continuous identical bits, the monitoring signal is generated at a relatively lower frequency. As the frequency of the monitoring signal increases, the monitoring signal includes more components reduced by the low-pass filter, and thus the attenuation amount of the amplitude becomes greater. In consequence, even at the same data transmission rate, the amplitude detector 24 detects different amplitudes depending on the data patterns.

In this embodiment, in order to reduce the foregoing data rate dependence and data pattern dependence, the reference amplitude generator 28 generates the reference signal corresponding to the input data signal Din, and the differential amplifier 26 compares the detected amplitude of the monitoring signal with the detected amplitude of the reference signal. As described above, the frequency of the input data signal is dependent upon the data transmission rate and the data stream. The frequency of the monitoring signal is equal to the frequency of the input data signal Din. Since the reference signal oscillates corresponding to the oscillation of the input data signal Din, the reference signal has the frequency equal to that of the input data signal Din. The reference signal is filtered by the low-pass filter 30 having the same frequency characteristic as the low-pass filter 22. Therefore, the amplitude of the reference signal is subjected to attenuation equivalent to that of the amplitude of the voltage signal filtered by the low-pass filter 22. For this reason, the attenuation of the amplitude of the voltage signal by the low-pass filter 22 is cancelled out by the attenuation of the amplitude of the reference signal by the low-pass filter 30. As a result, the data rate dependence and the data pattern dependence can be reduced in regulating the amplitude of the modulation current and in controlling the extinction ratio based on this regulation.

Second Embodiment

Figure 5:
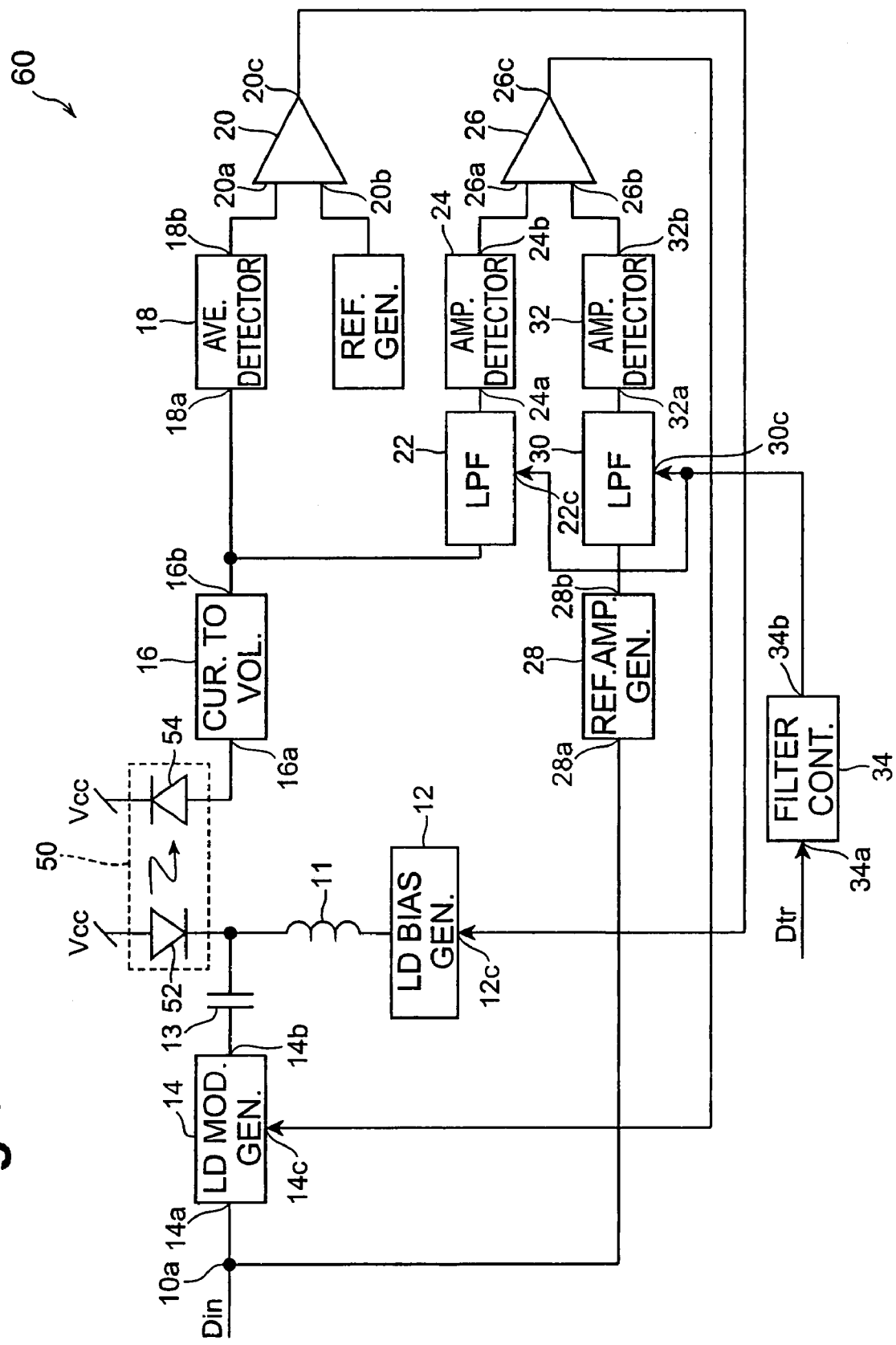
FIG. 5 is a diagram showing the configuration of a laser driver circuit of a second embodiment.

FIG. 5 is a diagram showing the configuration of a laser driver circuit 60 according to a second embodiment of the invention. The laser driver circuit 60 includes a filter control circuit 34 in addition to the components of the laser driver circuit 10. The differences between laser driver circuits 60 and 10 will now be described.

In the present embodiment, the cutoff frequencies of the low-pass filters 22 and 30 are variable, and the filter control circuit 34 controls these cutoff frequencies. The low-pass filters 22 and 30 have their respective control terminals 22c and 30c. An output terminal 34b of the filter control circuit 34 is connected to these control terminals 22c and 30c. The filter control circuit 34 sends a control signal from the output terminal 34b to the low-pass filters 22 and 30 to set their cutoff frequencies. Data transmission rate information Dtr of the input data signal Din is fed from an external circuit to an input terminal 34a of the filter control circuit 34.

According to the transmission rate information Dtr, the filter control circuit 34 regulates the cutoff frequencies of the low-pass filters 22 and 30 so as to set them lower than the data transmission rate. The filter control circuit 34 sets the cutoff frequencies of the low-pass filters 22 and 30 at an identical value. As a result, these cutoff frequencies will not exceed the data transmission rate of the input data signal Din even when the data transmission rate varies. Therefore, it is possible to reduce the crosstalk noise independent of the data transmission rate, thereby adequately stabilizing the extinction ratio of the optical output. In addition, it becomes feasible to optimize the cutoff frequencies according to the data transmission rate. Consequently, the laser driver circuit 60 is able to operate over a wide range of data transmission rates.

Third Embodiment

Figure 6:
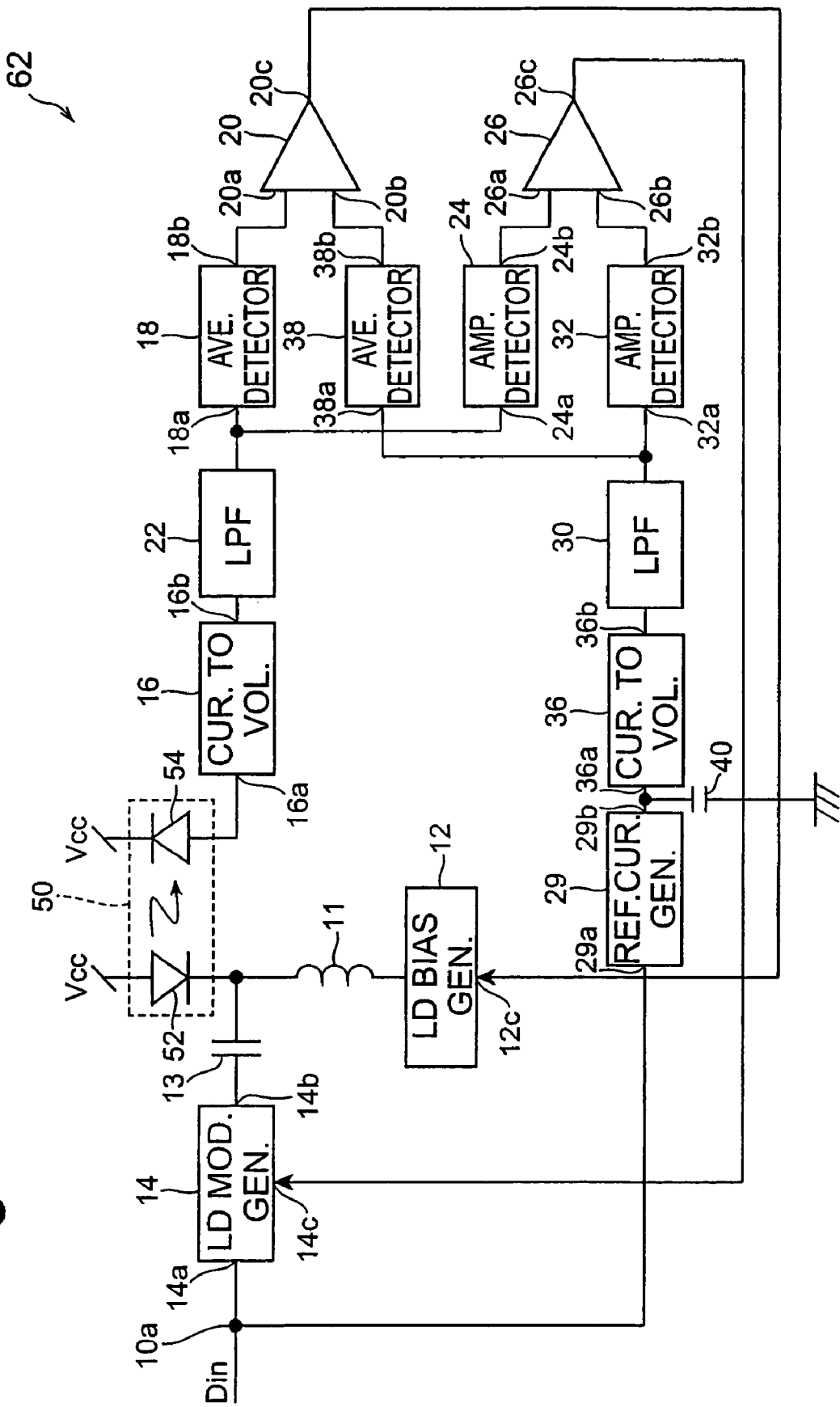
FIG. 6 is a diagram showing the configuration of a laser driver circuit of a third embodiment.

FIG. 6 is a diagram showing the configuration of a laser driver circuit 62 according to a third embodiment of the invention. The differences between the laser driver circuit 62 and the laser driver circuit 10 according to the first embodiment will now be described.

The laser driver circuit 62 has a reference current generator 29, a current-voltage converter 36, and a capacitor 40, instead of the reference amplitude generator 28 in the laser driver circuit 10. These components are electrically connected to each other.

The reference current generator 29 has an input terminal 29a connected to the data input terminal 10a of the laser driver circuit 62. The reference current generator 29 receives the input data signal Din through the data input terminal 10a to generate a reference current signal at an output terminal 29b. The reference current signal is a pulse signal corresponding to the input data signal Din. The reference current signal has constant amplitude, rises, and falls corresponding to the oscillation of the input data signal Din. The reference current generator 29 may include, for example, an amplifier for amplifying the input data signal Din, which is a voltage signal, and a voltage-current converter for converting the amplified voltage signal to a current signal.

The output terminal 29b of the reference current generator 29 is connected to an input terminal 36a of the current-voltage converter 36. The current-voltage converter 36 has the same circuit configuration as the current-voltage converter 16 connected to the PD 54, and thus has a current-voltage conversion characteristic substantially identical with that of the current-voltage converter 16. The current-voltage converter 36 receives the reference current signal generated by the reference current generator 29 to convert it to a voltage signal. This voltage signal is a reference signal to be compared with the monitoring signal in the present embodiment. This reference voltage signal is generated at an output terminal 36b of the current-voltage converter 36.

The low-pass filter 30 having the same frequency bandwidth with another low-pass filter 22 is connected to the output terminal 36b. The low-pass filter 30 receives the reference voltage signal from the current-voltage converter 36 to filter it. Thereafter, the amplitude detector 32 detects the amplitude of the filtered reference voltage signal to generate an output voltage corresponding to the detected amplitude. This output voltage is applied to the second input terminal 26b of the differential amplifier 26. The differential amplifier 26 generates at its output terminal 26c an output voltage corresponding to the difference between the output voltages of the amplitude detectors 24 and 32. The amplitude of the modulation current is negative-feedback controlled according to the output voltage of the differential amplifier 26, and the extinction ratio of the optical output is stabilized thereby.

In this embodiment, as described above, the reference voltage signal is generated by the current-voltage converter 36 which is same as the current-voltage converter 16. This allows the driver circuit to correct variation in the characteristic of the current-voltage converter 16, e.g., variation of the characteristic due to temperature change. This is because the current-voltage converter 36 exhibits the same characteristic variation as that of the current-voltage converter 16 to cancel out their characteristic variations. Consequently, this embodiment is able to more adequately stabilize the extinction ratio of the optical output.

The capacitor 40 is connected between the reference current generator 29 and the current-voltage converter 36. One terminal of the capacitor 40 is connected between the output terminal 29b of the reference current generator 29 and the input terminal 36a of the current-voltage converter 36, and the other terminal is grounded. The capacitor 40 is provided for correcting the influence of the capacitance of the PD 54 on the operation of the current-voltage converter 16.

The capacitor 40 is not essential. Whether it is necessary to correct the influence of the capacitance of the PD 54 using the capacitor 40 depends on the capacitance of the PD 54 and the circuit design of the laser driver circuit 62.

The laser driver circuit 62 has an average detector 38, instead of the reference voltage generator 19 in the laser driver circuit 10. An input terminal 38a of the average detector 38 is connected to the low-pass filter 30, and an output terminal 38b thereof is connected to the second input terminal 20b of the differential amplifier 20. The differential amplifier 20 generates at the output terminal 20c an output voltage according to the difference between the output voltages of the average detectors 18 and 38. The bias current generator 12 performs the negative feedback control on the magnitude of the bias current according to this output voltage. This stabilizes the average power of the optical output.

Thus, in this embodiment, the average of the reference signal corresponding to the input data signal Din, rather than the fixed reference voltage, is compared with the average of the monitoring signal. This reduces the variation in the duty ratio of the input data signal Din. Furthermore, not only the input signal to the amplitude detector, but also the input signal to the average detector is subjected to the band restriction by the low-pass filters 22 and 30. Even in such a control method, the same advantages as those of the first embodiment can be obtained.

It is possible to sufficiently stabilize the average power of the optical output even when the input signals to the average detectors 18 and 38 are not filtered by the low-pass filters 22 and 30. Therefore, the driver circuit may also be so configured that the low-pass filters 22 and 30 are provided immediately before the amplitude detectors 24 and 32 and that the monitoring signal and the reference signal are supplied to the average detectors 18 and 38 without passage through the low-pass filters 22 and 30.

The laser driver circuit 62 may further include the filter control circuit 34 described in the second embodiment. In this configuration, the low-pass filters 22 and 30 have variable cutoff frequencies.

Fourth Embodiment

Figure 7:
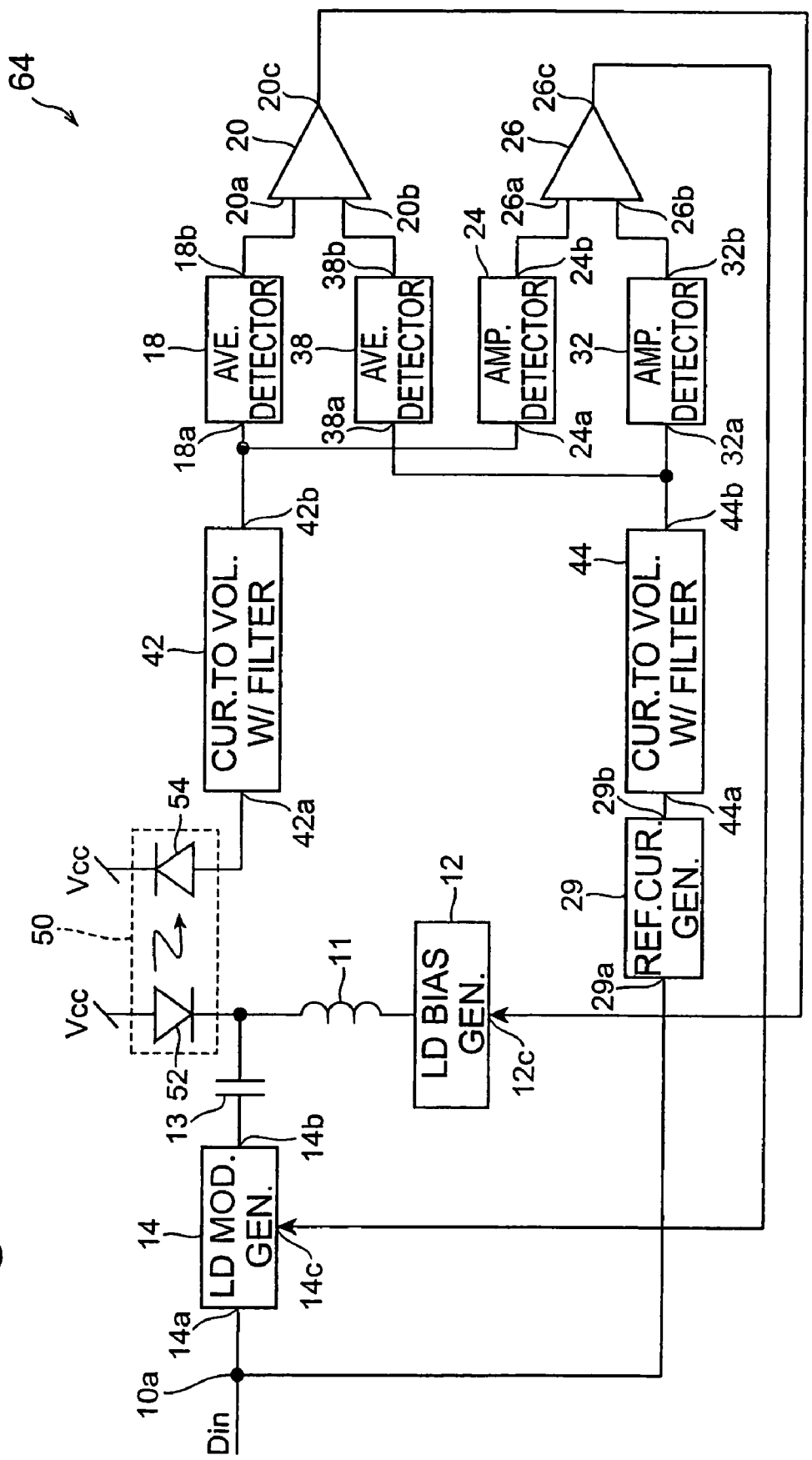
FIG. 7 is a diagram showing the configuration of a laser driver circuit of a fourth embodiment.

FIG. 7 is a diagram showing the configuration of a laser driver circuit according to a fourth embodiment of the invention. This laser driver circuit 64 has a configuration in which a single circuit replaces the current-voltage converter and the low-pass filter connected to the converter in the third embodiment. More specifically, the laser driver circuit 64 is configured so that a current-voltage converter 42 with a filter function replaces the current-voltage converter 16 and the low-pass filter 22 in FIG. 6, and a current-voltage converter 44 with a filter function replaces the current-voltage converter 36 and the low-pass filter 30 in the same drawing. This embodiment is configured without the capacitor 40 between the reference current generator 29 and the current-voltage converter 36; however, the capacitor 40 may be installed in the same manner as in the third embodiment.

These current-voltage converters 42 and 44 with the filter function have the same circuit configuration and thus have substantially identical operation characteristics. An input terminal 42a of the circuit 42 is connected to the anode of the PD 54 and an output terminal 42b thereof to the input terminal 18a of the average detector 18. An input terminal 44a of the circuit 44 is connected to the output terminal 29b of the reference current generator 29, and an output terminal 44b thereof to the input terminal 32a of the amplitude detector 32.

The operation of the current-voltage converters 42 and 44 with the filter function is the same as the current-voltage converters and low-pass filters in the third embodiment. Therefore, the laser driver circuit 64 has the same advantages as those of the laser driver circuit 62. of the third embodiment.

Fifth Embodiment

Figure 8:
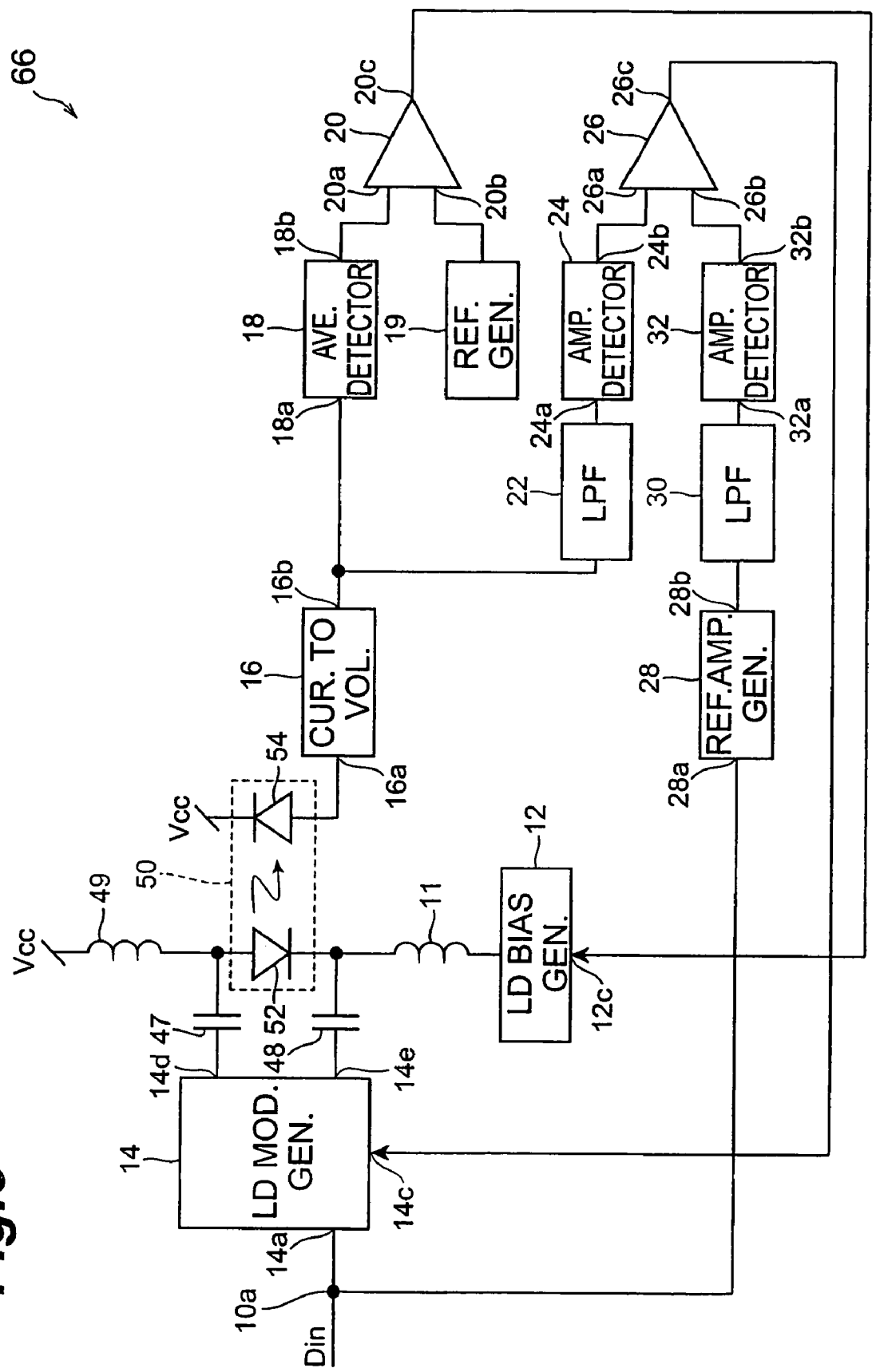
FIG. 8 is a diagram showing the configuration of a laser driver circuit of a fifth embodiment.

FIG. 8 is a diagram showing the configuration of a laser driver circuit according to a fifth embodiment of the invention. This embodiment relates . to an AC-coupled differential laser driver circuit 66. The differences between this laser driver circuit 66 and the laser driver circuit 10 of the first embodiment will now be described.

In the laser driver circuit 66, the modulation current generator 14 has two output terminals 14d and 14e. A modulation current having the same phase as that of the input data signal Din is generated at one of the output terminals 14d and 14e, and a modulation current having an inverted phase with respect to the input data signal Din at the other output terminal. In this embodiment, the anode of the LD 52 is connected to the positive power supply Vcc via inductor 49. The first output terminal 14d of the modulation current generator 14 is connected between the anode of the LD 52 and the inductor 49 via capacitor 47. The cathode of the LD 52 is connected through inductor 11 to the bias current generator 12. The second output terminal 14e of the modulation current generator 14 is connected through capacitor 48 between the cathode of the LD 52 and the inductor 11. The difference between the modulation currents at two output terminals 14d and 14e is superimposed on the bias current and then supplied to the LD 52. In consequence, the LD 52 generates the optical output corresponding to the input data signal Din.

The laser driver circuit 66 processes the output current from the PD 54 using the circuit configuration similar to the laser driver circuit 10 of the first embodiment, to control the optical output. Therefore, the laser driver circuit 66 has the same advantages as those of the laser driver circuit 10. Thus, the present invention is applicable to differential laser driver circuits, while achieving the same advantages as non-differential laser driver circuits do.

The present invention has been described in detail on the basis of the embodiments thereof. It is, however, noted that the present invention is by no means intended to be limited to the above embodiments. The present invention can be modified in various ways without departing from the spirit and scope of the invention.

The laser driver circuit of the fifth embodiment is a modification of the laser driver circuit shown in FIG. 1, into the differential one. Similarly, it is possible to modify the laser driver circuits shown in FIGS. 5 to 7, into the differential ones.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A laser driver circuit for driving a laser diode to generate an optical output corresponding to an input data signal with a data transmission rate, the laser driver circuit controlling the optical output based on an output current from a photodiode for detecting the optical output, the laser driver circuit comprising:

a biasing section for supplying a bias current to the laser diode;

a modulator for generating a modulation current corresponding to the input data signal to add the modulation current to the bias current;

a first current-voltage converter for converting the output current from the photodiode into a voltage signal;

a first low-pass filter for filtering the voltage signal, the first low-pass filter having a cutoff frequency lower than the data transmission rate;

a first amplitude detector for detecting an amplitude of the voltage signal filtered by the first low-pass filter;

a reference signal generator for generating a reference signal by receiving the input data signal directly;

a second amplitude detector for detecting an amplitude of the reference signal, a second low-pass filter having a frequency characteristic substantially identical with a frequency characteristic of the first low-pass filter, the second low-pass filter filtering the reference signal to output a filtered reference signal to the second amplitude detector, and a filter controller for adjusting the frequency characteristics of the first and the second low-pass filters according to the data transmission rate of the input data signal, the modulator regulating an amplitude of the modulation current according to a difference between the amplitude detected by the first amplitude detector and the second amplitude detected by the second amplitude detector.

2. The laser driver circuit according to claim 1, wherein the reference signal generator includes:

a reference current generator for generating a reference current by receiving the input data signal directly; and a second current-voltage converter for converting the reference current into a reference voltage signal, the second current-voltage converter having a configuration identical with a configuration of the first current-voltage converter.

3. The laser driver circuit according to claim 1, further comprising a first average detector for detecting an average of the voltage signal output from the first low-pass filter, the biasing section regulating a magnitude of the bias current according to the average of the voltage signal.

4. The laser driver circuit according to claim 3, further comprising a second average detector for detecting an average of the reference signal, output from the reference signal generator, the biasing section regulating the magnitude of the bias current according to a difference between the averages detected by the first average detector and the average detected by the second average detector.

5. The laser driver circuit according to claim 1, wherein the laser diode has an anode and a cathode, and the modulator has a first output terminal coupled with the anode of the laser diode via a capacitor, and a second output terminal coupled with the cathode of the laser diode via another capacitor, the modulation current including a first modulation current and a second modulation current, the first modulation current having the same phase as a phase of the input data signal, and a second modulation current having a phase opposite to the phase of the input data signal, and wherein the modulator generates the first modulation current at one of the first and second output terminals and the second modulation current at the other of the first and second output terminals.

6. The laser driver circuit according to claim 5, further comprising a second low-pass filter having a frequency characteristic substantially identical to a frequency characteristic of the first low-pass filter, the second low-pass filter filtering the reference signal to output a filtered reference signal to the second amplitude detector.

7. The laser driver circuit according to claim 5, further comprising a first average detector for detecting an average of the voltage signal output from the first current-voltage converter, the biasing section regulating a magnitude of the bias current according to the average of the voltage signal.

8. A laser driver circuit for driving a laser diode to generate an optical output corresponding to an input data signal with a data transmission rate and data patterns, the laser driver circuit controlling the optical output based on an output current from a photodiode that detects that optical output from the laser diode, the laser driver circuit comprising;

a first current-voltage converter for converting the output current from the photodiode into a voltage signal;

a first low-pass filter for filtering the voltage signal, the first low-pass filter having a cutoff frequency lower than the data transmission rate;

a first amplitude detector for detecting an amplitude of the voltage signal filtered by the first low-pass filter;

a reference signal generator for generating a reference signal by receiving the input data signal directly;

a second low-pass filter for filtering the reference signal, a second amplitude detector for detecting an amplitude of the reference signal; and a modulator for generating a modulation current with an amplitude based on a difference between the amplitude detected by the first amplitude detector and the amplitude detected by the second amplitude detector; and a filter controller for adjusting the frequency characteristics of the first and the second low-pass filters according to the data transmission rate of the input data signal, wherein the amplitude of the modulation current is independent of the data patterns and the data transmission rate of the input data signal.

* * * * *